United States Patent [19]

Lee

[11] 4,426,766

[45] Jan. 24, 1984

[54] METHOD OF FABRICATING HIGH DENSITY HIGH BREAKDOWN VOLTAGE CMOS DEVICES

[75] Inventor: William W. Y. Lee, Fountain Valley, Calif.

[73] Assignee: Hughes Aircraft Company, El Segundo, Calif.

[21] Appl. No.: 313,395

[22] Filed: Oct. 21, 1981

[51] Int. Cl.³ .......................................... H01L 21/265
[52] U.S. Cl. .................................. 29/571; 29/576 B; 29/579; 29/580; 148/187
[58] Field of Search ................ 29/571, 576 B, 576 W, 29/579, 580; 148/1.5, 187; 357/42

[56] References Cited

U.S. PATENT DOCUMENTS

| | | | |
|---|---|---|---|
| 3,986,896 | 10/1976 | Veno et al. | 148/1.5 |
| 4,013,484 | 3/1977 | Boleky et al. | 148/1.5 |
| 4,045,250 | 8/1977 | Dingwall | 148/187 X |
| 4,046,606 | 9/1977 | Lambert | 148/187 |
| 4,047,284 | 9/1977 | Spadea | 29/571 |
| 4,110,899 | 9/1978 | Nagasawa et al. | 29/571 |
| 4,277,291 | 7/1981 | Cerofolini et al. | 148/1.5 |
| 4,306,916 | 12/1981 | Wollesen et al. | 148/187 X |
| 4,313,768 | 2/1982 | Sanders et al. | 148/187 X |
| 4,314,857 | 2/1982 | Aitken | 148/187 X |
| 4,315,781 | 2/1982 | Henderson | 148/1.5 |

OTHER PUBLICATIONS

"RCA COS/MOS Integrated Circuits Manual", RCA Corp., 1971, pp. 1, 24 and 25.

Primary Examiner—G. Ozaki
Attorney, Agent, or Firm—G. B. Rosenberg; A. W. Karambelas; W. J. Bethurum

[57] ABSTRACT

A process of fabricating high density CMOS integrated circuits having conductively interconnected wells. The conductive interconnection is provided by a buried conductor formed in combination with channel stops encircling each of the wells and prior to the fabrication of FET active devices at the surface of the wells. The channel stops, as provided by the process, are automatically aligned with and spaced apart from the source and drain regions of their respective FETs.

15 Claims, 11 Drawing Figures

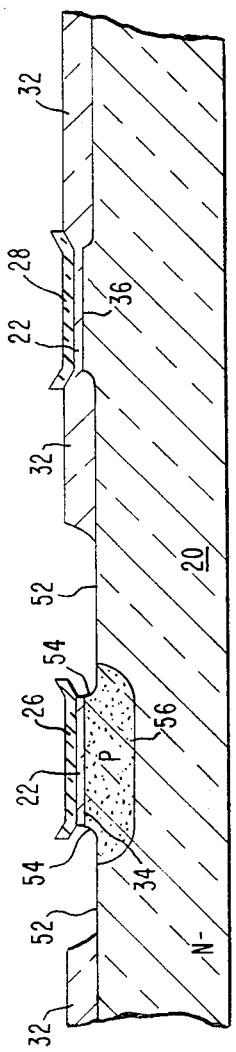
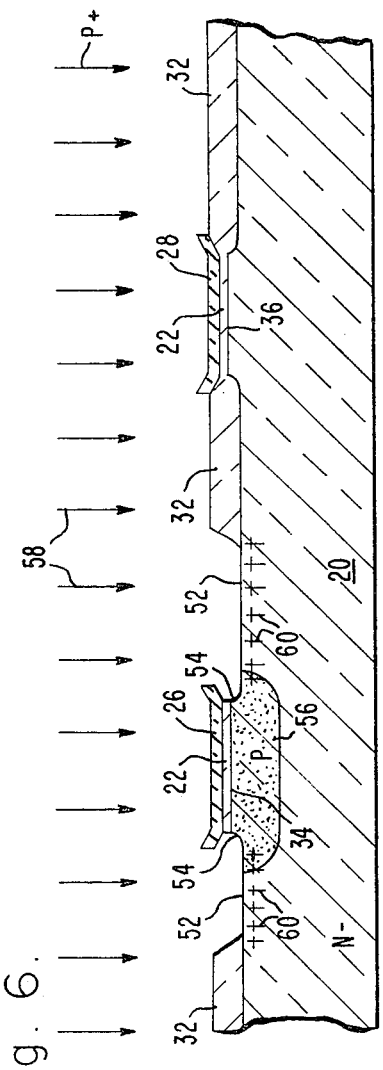
Fig. 5.
Fig. 6.

METHOD OF FABRICATING HIGH DENSITY HIGH BREAKDOWN VOLTAGE CMOS DEVICES

BACKGROUND OF THE INVENTION

1. Field of the Invention

The present invention relates generally to the fabrication of complementary insulated gate field effect transistors (commonly referred to as a CMOS FET or CMOS Device) and, more particularly, to a process of fabricating high density, high breakdown voltage complementary insulated gate field effect transistors (HCMOS FETs) having conductively interconnected wells.

2. Description of the Prior Art

The well-known CMOS FET device is typically composed of a closely spaced and appropriately interconnected pair of n-channel and p-channel field effect transistors. The CMOS device is usually fabricated on an n-type semi-conductor substrate, with the p-channel transistor being formed at the surface of the substrate and the n-channel transistor being formed at the surface of a p-type layer (p-well) doped into the substrate. The n and p-type transistors are then interconnected by polysilicon and metalization layers to form a CMOS FET device. As a building block for much larger and more complex integrated circuits, CMOS FETs provide a number of notable advantages including high noise immunity, low power-speed product, and near zero standby power requirement.

One significant disadvantage to the use of conventional CMOS devices in large scale integrated (LSI) circuits is that they inherently require a greater amount of substrate surface area than either functionally equivalent n- or p-channel FET devices. For example, the CMOS device density in an integrated circuit can be up to 40% less than the device density achieved by using conventional n-MOS technology.

This size disadvantage is directly related to the amount of substrate surface area required by each p-well. Naturally, the well surface must be sufficient to allow for alignment and processing latitudes in the CMOS fabrication procedure, thereby ensuring that the n- and p-channel transistors are suitably situated with respect to the p-well. However, in conventional CMOS devices, it must also be sufficient to allow for an electrical contact, separate from the n-channel transistor, to be placed on the well surface. This contact, further connected to an appropriate voltage potential source, is required in order to electrically isolate the well from the substrate by reverse biasing the well/substrate junction.

Another disadvantage arises when LSI CMOS devices are used in high voltage applications. In order to increase device density as much as possible, the parasitic channel stop associated with each transistor is allowed to overlap the transistor's source and drain regions. As is well known, channel stops are necessary to prevent the formation of parasitic channels between neighboring transistors. Typically, the channel stops are highly doped regions formed in the substrate surrounding each transistor and effectively block the formation of parasitic channels by substantially increasing the substrate's surface inversion threshold voltage. Also, they are by necessity opposite in conductivity type from the source and drain regions they overlap in order to prevent shorting. This, however, results in the formation of high doped and, therefore, low reverse breakdown voltage p-n junctions. Consequently, the maximum operating voltage potential of the CMOS integrated circuit is significantly limited.

SUMMARY OF THE INVENTION

A process is described for fabricating highly dense CMOS integrated circuits having conductively interconnected wells. The conductive interconnection is provided by first removing a contiguous portion of the field oxide layer, including that portion overlying the margin of each of the wells, to expose the underlying portion of the substrate surface. An impurity is then ion implanted under the exposed substrate surface to form an impurity layer overlapping and extending between each of the wells. By annealing this layer, a highly doped region is formed at the surface of the substrate that acts as a channel stop for each active device fabricated in the wells and as a highly conductive buried conductor interconnecting each of the wells.

By this process, the present invention permits a significant reduction in the amount of substrate surface area required by each well. Only a single well contact, further connected to an appropriate voltage potential source, is needed to reverse bias the well/substrate junctions of the interconnected wells.

Another advantage of the present invention is the provision of an automatically aligned separation between the source and drain regions of a transistor formed at the surface of the substrate and the channel stop surrounding the transistor. This aligned separation is provided by forming an oxygen impermeable mask over a first substrate region, on which the transistor is to be fabricated and which is spaced apart from a second substrate region. This mask also covers the substrate region interposed between the first and second regions. An oxide layer is then grown over the surface of the second substrate region. This layer includes an oxide beak that grows, by lateral oxidation, between the mask and the substrate so as to overlie only the interposed substrate region. Next, the oxide layer and beak are removed to expose the underlying substrate surface. An impurity is then ion implanted into the second substrate region to form a channel stop spaced apart from the first substrate region. By performing this implant at low energy, the mask effectively shields the interposing substrate region against the impurity ions. Another oxide layer is grown over the second substrate region with an oxide beak extending over the interposing substrate region. Consequently, when the mask is removed and the source and drain regions are formed in the first substrate region, using the oxide layer and beak as a shield against impurities for the interposing and second substrate regions, they are automatically aligned apart from the channel stop by the interposing substrate region. Since this interposing region is only lightly doped (the original doping level of the substrate), the reverse breakdown voltage of the resulting p-n junction is substantially greater than that of the p-n junction formed by the overlapping of a transistor's source and drain regions and its associated channel stop.

Still another advantage of the present invention is that it provides the above enumerated advantages without necessitating any additional processing steps.

These and other attendant advantages of the present invention will become apparent and readily appreciated as the same becomes better understood by reference to the following detailed description when considered in connection with the accompanying drawings, in which like reference numerals designate like parts throughout the figures.

BRIEF DESCRIPTION OF THE DRAWINGS

FIGS. 1–8 illustrate in cross-sectional form a CMOS device at successive steps of fabrication in accordance with the preferred embodiment of the invention;

DETAILED DESCRIPTION OF THE INVENTION

Figure 1:
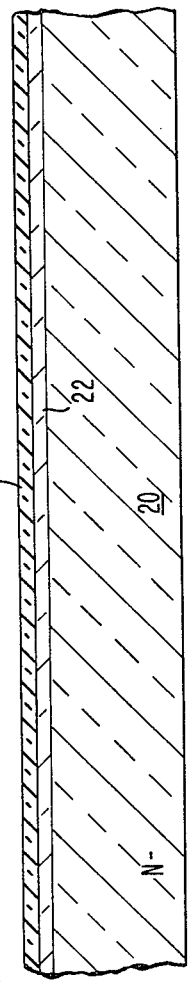

Referring now to the drawings which illustrate the successive processing steps for manufacturing complementary transistors according to the present invention, FIG. 1 shows a semiconductor substrate 20, preferably of silicon and suitably doped to have an n-type conductivity (a concentration of approximately $3 \times 10^{15}/cm^3$ of an n-type dopant), on which a relatively thin, approximately 700 Angstroms thick, silicon dioxide ($SiO_2$) layer has been grown. This oxide growth may be by any conventional method such as thermal oxidation in a suitable ambient. An oxygen impermeable layer 24, preferably of silicon nitride ($Si_3N_4$), is then deposited onto the surface of the oxide layer 22. The silicon nitride layer may be formed by any conventional deposition method so as to have a thickness of approximately 1,000 Angstroms.

Figure 2:
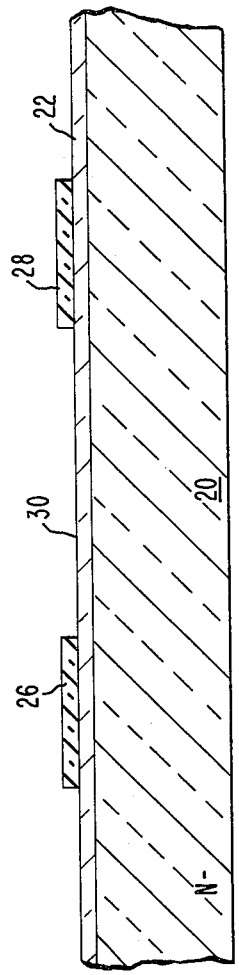

Next, portions of the silicon nitride layer 24 are selectively etched away to leave a plurality of paired first and second nitride masks, one such pair 26, 28 being shown in FIG. 2. It is at the substrate surface underlying these paired masks that the paired n- and p-channel transistors of each CMOS device are to be fabricated in the final step of the disclosed process. The selective etching of the silicon nitride layer may be by a nitride plasma etch and suitably performed to leave the thin oxide layer 22 intact.

Figure 3:
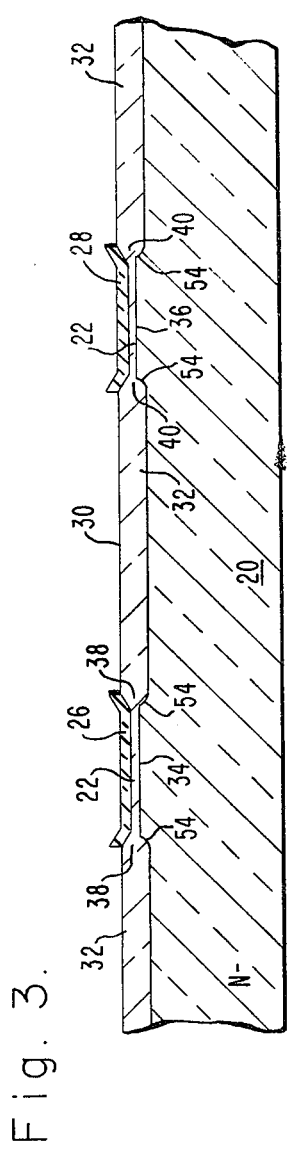

An additional thickness of silicon dioxide is then grown on the exposed portions 30 of the oxide layer 22. As shown in FIG. 3, this oxide growth, which may also be performed by any conventional oxide growth method to provide a total oxide thickness of approximately 3,800 Angstroms, results in the formation of an intermediate field oxide layer 32. The silicon nitride masks 26, 28, being oxygen impermeable, substantially prevent the further growth of the thin oxide layer 22 in the areas underlying the masks. The growth that does occur, as is generally known and expected, is caused by lateral oxidation during the growth of the intermediate field oxide layer 32. This results in the formation of oxide beaks 38, 40 that extend between the margin of the nitride masks 26, 28 and the respectively underlying portions of the semiconductor substrate 20. As a result of the oxide beak formation, the undercut margins of the nitride masks are forced upward while the respectively underlying portions of the substrate are reduced by oxidation to produce downwardly curved portions of the substrate surface 54. Thus, the beaks 38, 40 act to delimit first and second unreduced substrate surface areas 34, 36 symmetrically underlying the first and second nitride masks 26, 28 respectively. These surface areas 34, 36 also underlie the remaining portions of the thin oxide layer 22.

Figure 4:
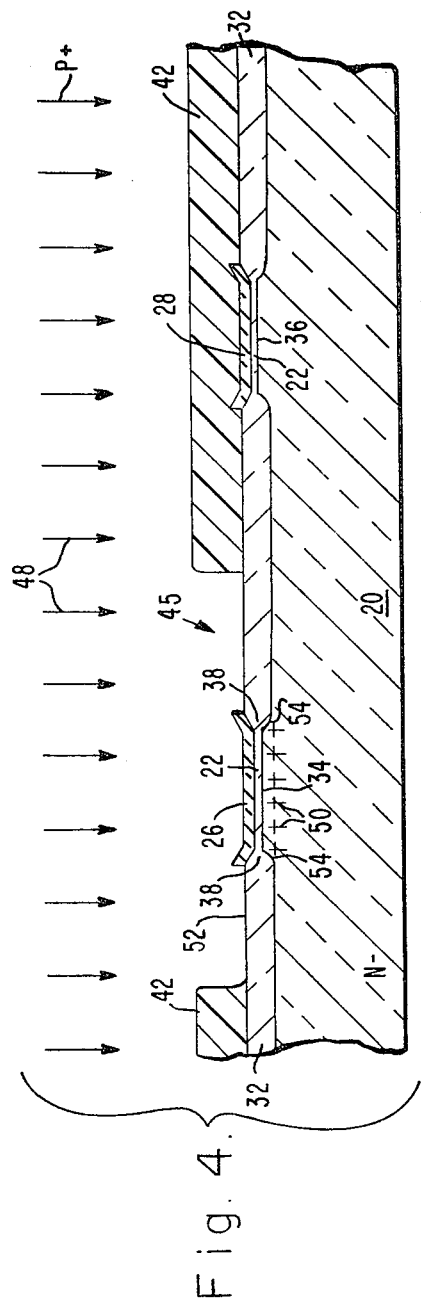

Referring now to FIG. 4, an etch resistant mask 42 is formed by covering the intermediate field oxide layer 32 and the silicon nitride masks 26, 28 with a photoresist material. A window 45 is then opened to expose each of the first silicon nitride masks 26, under which well layers are to be formed, and that portion of the intermediate field oxide surface 52 immediately surrounding and extending between each neighboring first nitride mask 26. A thin zone of p-type impurity ions 50 is then ion implanted, as indicated by the arrows 48, into the surface of the substrate 20. This ion bombardment is performed using conventional ion implantation techniques, at an implant energy sufficient to allow the impurity ions to pass through the first nitride masks 26 and the underlying thin oxide pad 22 but insufficient to cause the impurity ions to pass through either the intermediate field oxide layer 32 or the photoresist mask layer 42 overlying the second nitride masks 28. Consequently, the resulting zones of p-type impurity ions are coextensive with the first surface areas 34 and delimited by the downwardly sloped portions of the substrate surface 54. Preferably, a boron implant at 80 KeV is used to provide a surface concentration of $1 \times 10^{13}/cm^2$.

A standard oxide etch utilizing the etch resistant mask 42 is then performed to completely remove the exposed portions 45 of the intermediate field oxide layer 32. The oxide beak 38 is also etched away at this point while leaving the thin oxide pad 22, which underlies and is protected by the first nitride mask 26. Thus, portions of the substrate surface 52 extending between each of the first surface areas 34, including the downwardly curved portion 54 surrounding each, are exposed, as is shown in FIG. 5. The photoresist mask 42 is then removed.

Next, the zones of p-type impurity ions are thermally diffused into the bulk of the substrate 20 to form a p-well 56 beneath each. As a result, the laterally diffused edges of the p-wells extend beyond, yet remain symmetrically aligned with, the edges of their respective nitride masks 26. This drive-in diffusion is preferably performed in an inert atmosphere, such as nitrogen, at a temperature of approximately 1,180° C. for a period of approximately 27 hours to produce p-wells having conductivity of approximately 2000 ohm/sq.

Following the well drive-in diffusion, a second ion implantation of p-type impurities is performed. This ion bombardment, generally indicated by the arrows 58 in FIG. 6, is performed at an implant energy sufficient for the ions to penetrate the exposed portions of the substrate surface 52, but insufficient to penetrate either the nitride masks 26, 28 or the remaining portions of the intermediate field oxide layer. This creates a zone of ions 60 at the surface of the substrate which surrounds each of the wells 56 to act as channel stops. These channel stops, however, do not extend under the downwardly curved portions of the substrate surface 54, since those portions of the substrate are shielded during the ion bombardment by the overhanging margins of the nitride masks 26. Consequently, these channel stops are inherently aligned with, and spaced apart from the source and drain regions of the n-channel FET eventually formed at the first surface area 34 of each of the wells 56.

Figure 9:
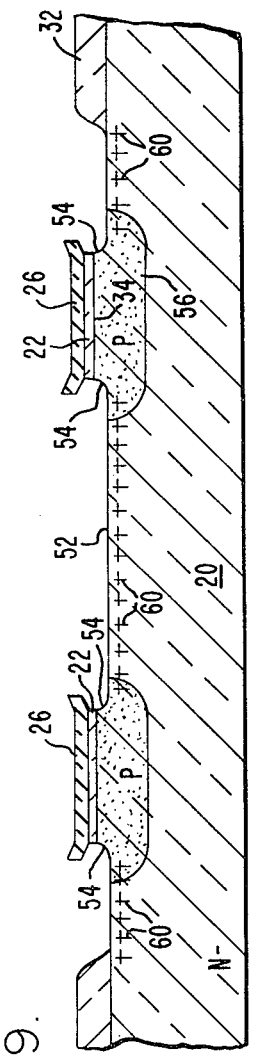
FIG. 9 illustrates in cross-sectional form the wells of two different CMOS device conductively interconnected by a buried conductor at an equivalent processing step as that of FIG. 6.

Referring now to FIG. 9, which show the well portions of two separate, but neighboring or adjacent CMOS devices, it can be seen that this zone of ions 60 is also implanted beneath the exposed surface of the substrate 52 extending between the neighboring p-wells 56. Since the diffused edges of the wells 56 extend beyond the edges of the nitride masks 26, the zone 60 overlaps the periphery of each of the wells. Thus, it forms a buried conductor that conductively interconnects the adjacent wells 56. In the present process, this zone is preferably formed by a boron implant at 10 KeV to obtain a surface concentration level of between $7 \times 10^{13}$ to $2.5 \times 10^{14}/cm^2$. This very low energy implant, relative to the implant energy of the first ion implant used to provide the well region 56 impurities, inherently provides a shallow channel stop zone of ions 60.

Figure 7:
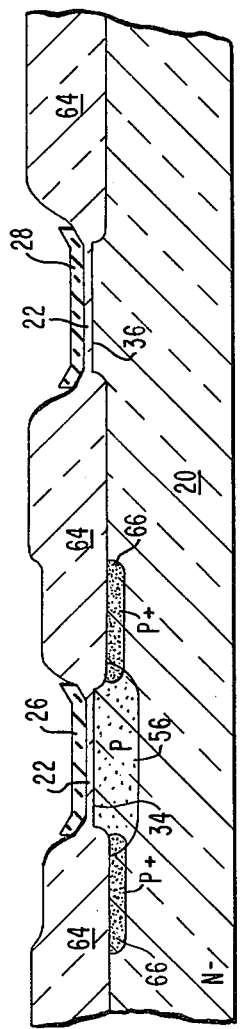

A thick layer of oxide is then grown on the exposed portions of the substrate surface 52 and the remaining field oxide layer 32, by low temperature thermal oxidation in a suitable ambient to form a relatively thick final field oxide layer 64, as illustrated in FIG. 7. This step is performed at a low temperature to prevent any further lateral diffusion of the p-well, but at a temperature sufficient to anneal and, thereby, to complete the formation of the parasitic channel stops 66 surrounding each of the wells and of the buried conductors (not shown) that interconnects the adjacent wells. Naturally, such a temperature will be insufficient to cause any significant diffusion, lateral or otherwise, of the parasitic channel stop 66. As a result, they remain closely aligned with the edges of the nitride mask 26 and, therefore, spaced apart from the source and drain regions of the n-channel FET eventually formed at the first surface area 34 of each of the wells 56. Preferably, the oxide is grown at a temperature of approximately 925° C. for a time period sufficient to produce a final field oxide layer 64 having a thickness of approximately 1.2 micron. The conductivity of the annealed channel stops and buried conductors should be equal to or greater than the conductivity of the p-wells. For the zone surface concentrations noted above, the conductivity of the resulting channel stops and buried conductors are significantly greater than the conductivity of the wells. Even higher channel stop and buried conductor conductivities can be obtained by implanting the zone of ions 60 to a surface concentration level of $2 \times 10^{15}/cm^2$, or more.

Figure 8:
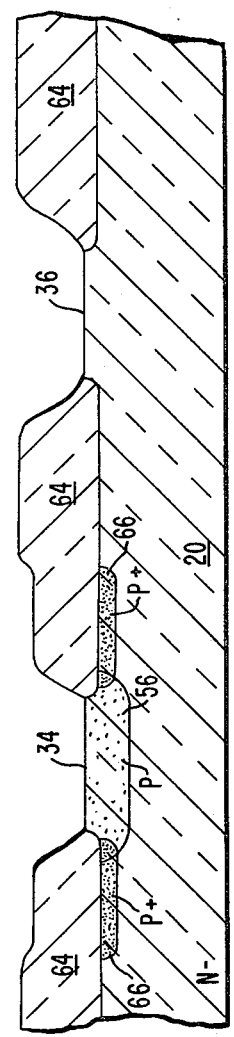

Following the growth of the final field oxide layer 64, all of the first and second nitride masks 26, 28 and the underlying thin oxide layers 22 are removed to expose the first and second surface areas 34, 36, as shown in FIG. 8.

Figure 10:
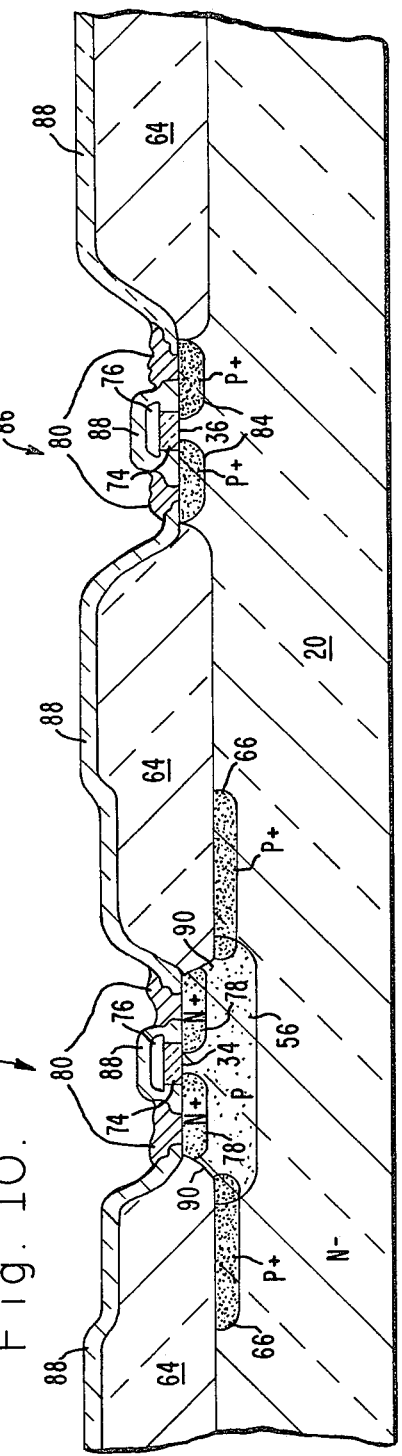
FIG. 10 illustrates in cross-section form one possible configuration of a completed HCMOS device.

At this point, literally any method of fabricating n- and p-channel field effect transistors on these surface areas can be used. A preferable series of steps leading to the production of the structure shown in FIG. 10 includes forming an n-doped polysilicon gate electrode 76 on an insulating gate oxide layer 74 located on the surface of each of the substrate surface areas 34, 36. This is followed by ion implanting n-type impurities into the surface of the first surface region 34 to form source-and-drain regions 78 for an n-channel FET 82 and p-type impurities into the second surface region 36 to form p-type source-and-drain regions 84 to produce a p-channel FET 86. Since the source and drain regions of the n-channel FET 82 remain largely beneath the first surface region 34, the channel stop 66 is spaced apart from the source and drain regions 78 by the interposed substrate region 90. As previously discussed, the reverse breakdown voltage of the p-n junction formed by the source and drain regions 78 and the interposed region 90 is significantly greater than that formed by allowing the highly doped channel stop to overlap the source and drain regions.

Figure 11:
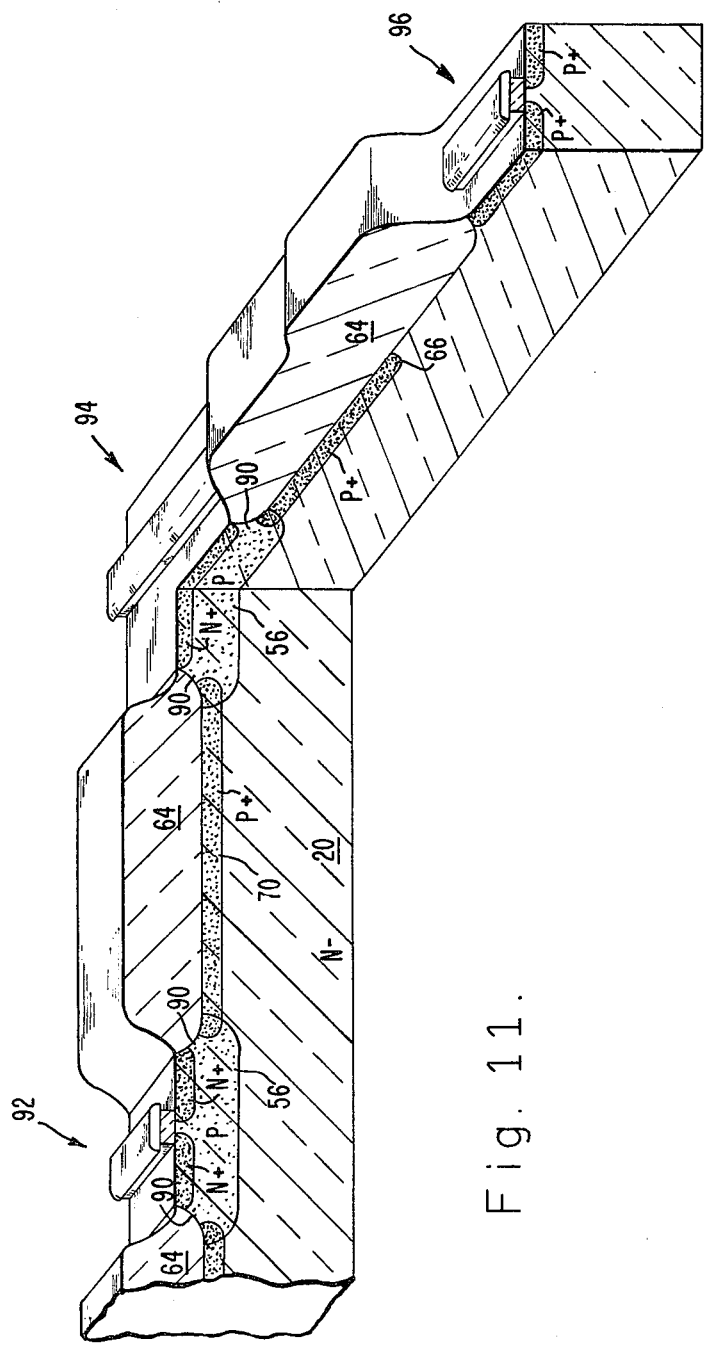
FIG. 11 is a cut away perspective illustration of a pair of HCMOS FET devices having conductively connected wells.

This interposed region 90 is also shown in FIG. 11. This figure provides a cutaway perspective illustration of two n-channel FET's 92, 94 whose adjacent p-wells 56 are conductively connected by a buried conductor 70, and a p-channel FET 96 electrically isolated from the p-wells by the channel stop 66.

Again referring to FIG. 10, an insulating layer of phosphosilicate glass 88 is then deposited conventional onto the surface of the n- and p-channel FETs 82, 86. Contact windows are then opened in the glass layer 88 above the source and drain regions. A window (not shown) is also opened for the well bias contact, the location of which may be over any one of the conductively interconnected well surface regions 34 or the buried conductor 70 as it extends between the wells 56. An aluminum layer 80 may then be vacuum deposited and appropriately etched to provide the required aluminum contacts and wiring pattern to combine pairs of n- and p-type FET devices into single CMOS FET devices. Finally, an overglass layer of silicon dioxide (not shown) may be deposited over the surface of the circuit to provide a reliable barrier against contamination.

Thus, there is disclosed a process of fabricating high density CMOS devices having channel stops that are automatically aligned with and spaced apart from the source and drain regions of their respective FET's and having wells that are conductively interconnected by a buried conductor.

Obviously, many modifications of the present invention are possible in light of the above description of the preferred embodiment. These modifications may include reversing the specific conductivity type of the substrate and regions formed therein, and changes in the specific impurities, the impurity concentrations, and the processing times and temperatures employed. The modifications may also include the fabrication of a doublewell structure, where both p-type and n-type wells are present on a single substrate, each of the wells of the same conductivity type being conductively interconnected by channel stops and buried conductors also of the same conductivity type. In addition, the specific details of the standard and well known oxide growth, photolithographic and phosphosilicate glass deposition steps have been omitted in order not to obscure the present process. It is therefore to be understood that, within the scope of the appended claims, the invention may be practiced otherwise than as specifically described.

What is claimed is:

1. A method of fabricating complementary insulated gate semiconductor devices comprising the steps of:
   (a) providing an oxide layer on a major surface of a semiconductor substrate of a first conductivity type, said oxide layer overlying a plurality of first and second surface regions of said substrate;
   (b) forming a number of oxygen-impermeable masks on said oxide layer, each said mask overlying a corresponding one of said first or second surface regions;
   (c) growing an additional thickness of oxide on the unmasked portion of said oxide layer to form an intermediate field oxide layer thereon, said layer including an oxide beak extending between the margin of each said oxygen-impermeable mask and the respective underlying portion of said substrate surface;

(d) forming over said substrate surface an etch resistant mask having a number of windows therein, each said window exposing at least one of said oxygen impermeable masks overlying said first surface regions of said substrate and, at least, an immediately surrounding portion of said intermediate field oxide layer;

(e) ion implanting a first impurity of a second conductivity type into said substrate with sufficient energy for said impurity ions to pass through each said exposed oxygen-impermeable mask and the underlying oxide layer to form zones of impurity atoms under the surface but with insufficient energy to pass through said intermediate field oxide layer or said etch resistance mask;

(f) etching away those portions of said intermediate field oxide layer exposed by said etch resistant mask to expose the underlying surface of said substrate;

(g) removing said etch resistant mask;

(h) thermally diffusing each said zone of first impurity atoms into the bulk of said substrate to form wells therein, each well underlying one of said first surface regions of said substrate;

(i) ion implanting a second impurity of said second conductivity type into said substrate with sufficient energy to form a zone of second impurity atoms at the exposed surface thereof, but with insufficient energy to pass through either said oxygen-impermeable masks or said intermediate field oxide layer;

(j) growing an additional thickness of oxide on the exposed portion of said substrate surface to form a final field oxide layer thereon; and (k) removing said oxygen-impermeable masks and the underlying oxide layer to expose said first and said second surface regions of said substrate, selectively forming gate insulation and electrode layers on said surface regions, forming insulated gate field effect transistors' source and drain regions of said first conductivity type in the substrate of said first surface regions and having said second surface regions, and connecting said transistors to form complementary insulated gate semiconductor devices.

2. The method of claim 1 wherein:
(a) said zones of second impurity atoms are annealed to form parasitic channel stops incidental to the step of growing said final field oxide layer; and
(b) the ion implanted concentration of said second impurity is sufficient to make the electrical conductivity of said annealed parasitic channel stops equal to or greater than the conductivity of said wells.

3. The method of claim 2 wherein, in the step of forming said etch resistant mask, at least one of said windows commonly exposes at least two of said oxygen impermeable masks overlying said first surface regions of said substrate and a contiguous portion of said intermediate field oxide layer extending between said commonly exposed oxygen impermeable masks, so that in the step of ion implanting said second impurity, a contiguous zone of impurity atoms is formed at the surface of said substrate, said contiguous zone extending between the wells underlying said commonly exposed oxygen impermeable masks and forming a buried conductor layer thereinbetween.

4. The method of claim 3 wherein the process of forming said oxide layer and said oxygen-impermeable masks comprises the steps of:
(a) thermally oxidizing said major surface of said substrate so as to form said oxide layer;
(b) depositing a layer of an oxygen-impermeable material over the surface of said oxide layer; and
(c) selectively removing a portion of said oxygen-impermeable material to leave a number of said oxygen-impermeable masks respectively overlying said first and said second surface regions of said substrate.

5. The method of claim 4 wherein said oxygen-impermeable material is silicon nitride.

6. The method of claim 5 wherein said first conductivity type is characteristic of N-type semiconductor material and said second conductivity type is characteristic of P-type semiconductor material.

7. The method of claim 5 wherein said first conductivity type is characteristic of P-type semiconductor material and said second conductivity type is characteristic of N-type semiconductor material.

8. In the fabrication of complementary insulated gate semiconductor devices, a method of forming a buried conductor layer that conductively connects a plurality of wells comprising the steps of:
(a) providing a major surface of a semiconductor substrate of a first conductivity type an oxide layer having a number of oxygen-impermeable masks located thereon;
(b) growing an additional thickness of oxide on the unmasked portion of said oxide layer to form a field oxide layer thereon, said field oxide layer including an oxide beak extending between the margin of each said oxygen-impermeable mask and the respective underlying portion of said substrate surface;
(c) providing wells of a second conductivity type within said substrate, each said mask being associated with a respective one of said wells;
(d) selectively removing a portion of said field oxide layer including said oxide beaks so as to expose an area of said substrate surface including a first area immediately surrounding and partially overlying each said well and a second area extending between and contiguous with each said first area;
(e) ion implanting an impurity of a second conductivity type into said substrate with sufficient energy to form a zone of impurity atoms at the exposed surface thereof, but with sufficient energy to pass through either said oxygen-impermeable masks or said field oxide layer; and
(f) annealing said zone of impurity atoms to form a buried conductor of said second conductivity type conductively interconnecting said wells.

9. The process of claim 8 wherein the ion implanted concentration of said impurity is sufficient to make the electrical conductivity of said buried conductor equal to or greater than the conductivity of said wells.

10. The method of claim 9 wherein the step of annealing said zone of impurities is incidental to the step of growing an additional thickness of oxide on the unmasked portion of said substrate surface by low temperature thermal oxidation.

11. A method of fabricating a CMOS device including at least one CMOS FET having a self-aligned spacing between the source and drain regions of a FET of said CMOS FET and a channel stop associated with said FET, said CMOS FET being formed at the surface of a substrate having an oxide layer thereon and a mask overlying said oxide layer, wherein the improvement comprises utilizing the margin of said mask to delimit a region of said substrate effectively interposed between said source and drain regions and said channel stop by a process comprising the steps of:

(a) growing the exposed portions of said oxide layer to form an intermediate oxide layer, the formation of an oxide beak extending between the margin of said mask and said substrate being incidental to the growth of said intermediate oxide layer, said oxide beak thereby defining the margin of said mask, an active device surface region of said substrate underlying and being within the margin of said mask;

(b) removing at least a portion of said intermediate oxide layer adjacent said mask including the associated portion of said oxide beak so as to expose the otherwise underlying portion of said substrate surface;

(c) implanting ions into the exposed surface of said substrate at an energy insufficient for any of said ions to pass through said mask or said intermediate oxide layer so as to form a channel stop region in a portion of said substrate adjacent but noninclusive of any significant portion of said substrate underlying said mask, said channel stop region thus being in registration with the edge of said mask and spaced apart from said active device surface region of said substrate;

(d) growing a final oxide layer on the exposed portion of said substrate including a new oxide beak extending under the margin of said mask so as to delimit said active surface region to an area within the margin of said mask, said final field oxide being grown such that said channel stop region is annealed to form said channel stop without any significant diffusion of said implanted ions;

(e) removing said mask layer and the remaining portion of said oxide layer immediately overlying said active device surface region, thereby exposing only said active device surface region; and (f) providing said source and drain regions of said FET essentially within the portion of said substrate underlying said active device surface region.

12. The method of claim 11 wherein the thermal processing associated with the provision of said source and drain regions and any other thermal processing step is performed such that said channel stop and said source and drain regions remain in registration with one another and said active device surface region so as to remain spaced apart by an effectively interposed portion of said substrate.

13. The method of claim 12 further comprising the steps of:

(a) implanting well-region ions, after the step of growing said intermediate oxide layer and before the step of removing a portion thereof, into said substrate with sufficient energy to pass through said mask and the remaining immediately underlying portion of said oxide layer but with insufficient energy to pass through said intermediate oxide layer; and (b) diffusing said well-region ions, after the step of removing a portion of said intermediate oxide layer and before the step of implanting ions, into said substrate to form a well-region therein extending at the surface of said substrate beyond the edges of said mask, the conductivity-type of said wellregion being the same as that of said channel stop and opposite that of said substrate.

14. The method of claim 13 wherein the implantation energy of said ion implantation used to form said channel stop region is approximately 10 KeV.

15. The method of claim 14 wherein said ion implantation used to form said channel stop region is performed so as to provide an ion concentration of approximately $7.0 \times 10^{13}/cm^2$ or more.

* * * * *